(12) United States Patent
Masumoto et al.

(10) Patent No.: US 6,830,956 B2
(45) Date of Patent: Dec. 14, 2004

(54) METHOD FOR PACKAGING A LOW PROFILE SEMICONDUCTOR DEVICE

(75) Inventors: Mutsumi Masumoto, Beppu (JP); Kenji Masumoto, Hayami-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/218,152

(22) Filed: Aug. 13, 2002

(65) Prior Publication Data

US 2003/0036219 A1 Feb. 20, 2003

(30) Foreign Application Priority Data

Aug. 13, 2001 (JP) .......................................... 2001-245359

(51) Int. Cl.[7] .......................... H01L 21/44; H01L 21/48; H01L 21/50
(52) U.S. Cl. ....................... 438/108; 438/113; 438/114; 438/127
(58) Field of Search ................................. 438/113, 114

(56) References Cited

U.S. PATENT DOCUMENTS 6,071,755 A  *  6/2000  Baba et al. ................. 438/106
6,114,191 A  *  9/2000  Young et al. ............... 438/125
6,117,704 A  *  9/2000  Yamaguchi et al. ......... 438/100
6,235,552 B1 *  5/2001  Kwon et al. ................. 438/106
6,294,439 B1 *  9/2001  Sasaki et al. ............... 438/464

\* cited by examiner

*Primary Examiner*—John F. Niebling
*Assistant Examiner*—Angel Roman
(74) *Attorney, Agent, or Firm*—W. Daniel Swayze, Jr.; W. James Brady; Frederick J. Telecky, Jr.

(57) ABSTRACT

A method to realize low-profile semiconductor devices by grinding a resin sealed block and realize level grinding by eliminating warpage of the resin sealed block. Semiconductor devices 10 are produced by step (B) in which multiple semiconductor chips 11 are mounted face down onto the surface of substrate 12, step (C) in which molding resin 13 is injected onto substrate 12 in order to form resin sealed block 18 in which multiple semiconductor chips 11 are sealed, step (E) in which resin sealed block 18 is cut halfway from the side of substrate 12, and step (F) in which resin sealed block 18 is ground from the side of molding resin 13 in order to separate it into individual semiconductor devices 10.

14 Claims, 3 Drawing Sheets

US 6,830,956 B2

METHOD FOR PACKAGING A LOW PROFILE SEMICONDUCTOR DEVICE

This application claims priority from Japanese patent application number 13(2001)-245359, filed Aug. 13, 2001.

FIELD OF THE INVENTION

The present invention pertains to a semiconductor device manufacturing method. More specifically, it pertains to a semiconductor device manufacturing method that lowers the profile of semiconductor devices, and that improves the productivity and the measurement accuracy of the semiconductor devices during the production of semiconductor devices in which the semiconductor chips are mounted face down (flip chip) onto a substrate.

BACKGROUND OF THE INVENTION

As portable telephone units, portable computers, and other compact electronic equipment become more popular, there is a growing need for compact low-profile semiconductor devices to be installed in them. As a chip mounting method for producing compact semiconductor devices, a flip-chip method in which semiconductor chips are mounted face down onto a substrate is available. With said method, the semiconductor devices can be made more compact than with a wire bonding method in which semiconductor chips mounted face up onto the substrate are connected to the substrate by means of wire bonding because areas for achieving electrical connection between the semiconductor chips and the substrate can be housed within the chip size.

With the flip-chip method, the semiconductor devices are produced by the following steps; that is, multiple semiconductor chips are mounted onto a substrate having adjoining multiple chip mounting areas with their functional planes facing the plane of said substrate, a molding resin is injected onto the aforementioned substrate in order to form a resin sealed block in which the aforementioned multiple semiconductor chips are sealed, bump electrodes for mounting the aforementioned semiconductor devices onto an external substrate are formed on the bottom of the aforementioned substrate, and the aforementioned resin sealed block is diced into individual semiconductor devices. They have a layered structure of the kind shown in FIG. 5 in terms of their profile.

To make aforementioned semiconductor device P low-profile, respective layers A–E constituting semiconductor device P need to be made as thin as possible. However, while studies are being conducted to make chip mounting bump layer C, substrate layer D, and external substrate mounting bump layer E thinner, their threshold values are about to be reached, and no more drastic low-profiling can be expected. In addition, molding resin layer A (coating layer on the non-functional plane of the chip) is formed in a space between the non-functional planes of the semiconductor chips and the mold. Thus, if said space is eliminated, the flow of the molding resin in the mold gets hindered, resulting in a risk of a productivity decrease and molding deficiency. In addition, the thickness of semiconductor chip layer B is determined in consideration of the steps (for example, plated bumps) prior to their mounting onto the substrate and the handling of the semiconductor chips during the substrate mounting step. Thus, if it is made too thin, cracks occur during the handling and result in a decrease in the yield.

Accordingly, a suggestion may be made that the top side (non-functional plane side) of aforementioned semiconductor device P is ground to make it thin while it is in the resin sealed block stage. However, because the resin sealed block has the aforementioned layered structure, it is likely to get warped due to the shrinkage of the molding resin and the difference in the thermal expansion coefficients of the respective layers. Thus, the resin sealed block cannot be secured firmly, and the amount of the grinding becomes uneven, so that the thickness accuracy of the semiconductor device may be deteriorated. Moreover, 2 tape application steps are needed a retaining tape needs to be put on the plane used to fix the resin sealed block during the grinding of the resin sealed block; and the retaining tape needs to be applied during the dicing step. As a result, not only the production process gets complicated, but there is also a problem that the amount of the tape used increases.

Therefore, the purpose of the present invention is to present a semiconductor device manufacturing method by which not only the semiconductor device can be low-profiled by grinding the resin sealed block, but uniform grinding can also be realized by eliminating the warpage of the resin sealed block, and simplification of the production process and reduction in the amount of the tape used can be realized by reducing the tape application step.

SUMMARY OF THE INVENTION

In order to achieve the aforementioned goal, the semiconductor device manufacturing method pertaining to the present invention involves a step in which multiple semiconductor chips are mounted onto on a substrate having adjoining multiple chip mounting areas with their functional planes facing the mounting plane of the aforementioned substrate, a step in which a molding resin is injected onto the aforementioned substrate in order to form a resin sealed block in which the aforementioned multiple semiconductor chips are sealed, a step in which the aforementioned resin sealed block is cut halfway to a prescribed depth from the side of the aforementioned substrate along lines separating the aforementioned chip mounting areas from each other in order to form cut recesses, and a step in which the aforementioned resin sealed block is ground from the side of the aforementioned molding resin at least until the aforementioned cut recesses are reached in order to separate it into individual semiconductor devices.

In addition, it is preferable that a step in which electrodes are formed on the plane opposite to the semiconductor mounting plane of the aforementioned substrate to serve as external connection terminals for the aforementioned semiconductor devices is provided before the aforementioned halfway cutting step. In such case, handling of the resin sealed block during the formation of the bump electrodes can be made easier by forming the external substrate mounting bump electrodes (external connection terminals) before the resin sealed block is cut halfway.

In addition, it is preferable that the depth of the aforementioned cut recesses is 30% or less of that of the aforementioned molding resin in the aforementioned halfway cutting step. In such case, bending of the resin sealed block can be prevented by securing a minimum connecting strength.

In addition, it is preferable that the aforementioned halfway cutting step includes a step in which the aforementioned molding resin is fixed by suction using a suction device when forming the aforementioned cut recesses. The aforementioned grinding step includes a step in which a retaining tape is put on the aforementioned substrate when separating the aforementioned semiconductor devices and a step in which the aforementioned resin sealed block is fixed by suction via the aforementioned retaining tape using a suction device. In such case, the retaining tape application step is required only once, so that not only the production process can be simplified, but the amount of the retaining tape used can also be reduced.

In addition, it is preferable that the aforementioned molding resin and the aforementioned semiconductor chips are ground during the aforementioned grinding step in such a manner that the thickness of the aforementioned semiconductor chips after the grinding becomes 60% or less of that before the grinding. In such case, there is no need to form thin semiconductor chips thin prior to the mounting of the semiconductor chips onto the substrate, the problem of cracks in the semiconductor chips during the handling of the semiconductor chips before they are mounted onto the substrate can be avoided, and the productivity and the yield can be improved. Furthermore, the semiconductor devices can be made drastically low-profile.

In addition, it is preferable that a step in which a heat sink is provided on the ground planes of the aforementioned molding resin and the aforementioned semiconductor chips is after the aforementioned grinding step. In such case, not only can the heat dissipation trait of the semiconductor chips be improved, but the semiconductor chips can also be protected by the heat sink.

REFERENCE NUMERALS AND SYMBOLS AS SHOWN IN THE DRAWINGS

In the figures, 10 represents a semiconductor device, 11 represents a semiconductor chip, 12 represents a substrate, 13 represents a molding resin, 14 represents an external substrate mounting bump electrode, 18 represents a resin sealed block, 21 represents a cut recess, 22 represents a retaining tape, 23 represents a grinder, and 24 represents a heat sink.

DESCRIPTION OF EMBODIMENTS

Embodiments of the present invention will be explained below according to the figures. Although each part in each figure is illustrated in a simplified form in order to facilitate the understanding of the present invention and those parts that are not important are omitted from the illustrations at the earliest possible opportunity, they can be understood easily by those in the field.

Figure 1A:
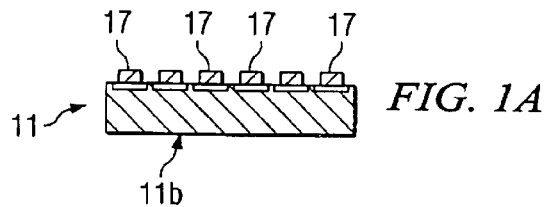
FIG. 1 represents diagrams showing the semiconductor device production steps pertaining to the first embodiment of the present invention.
Figure 1B:
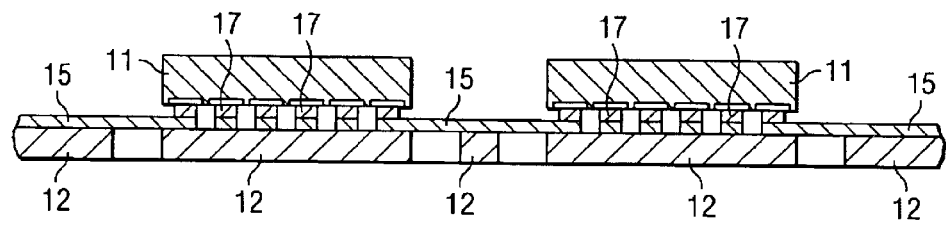
Figure 1C:
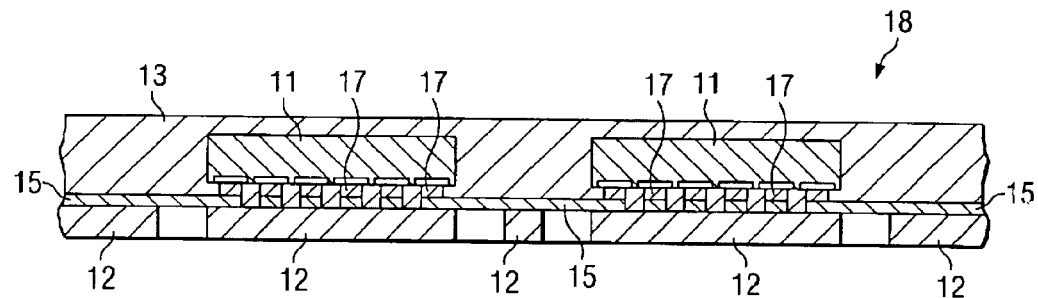
Figure 1D:
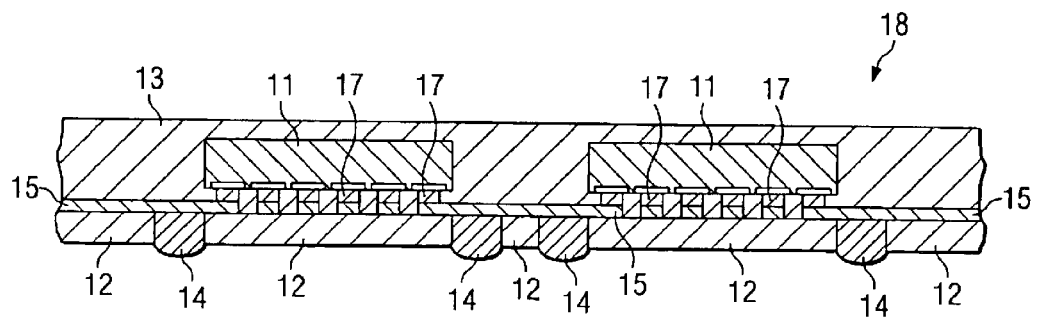
Figure 1E:
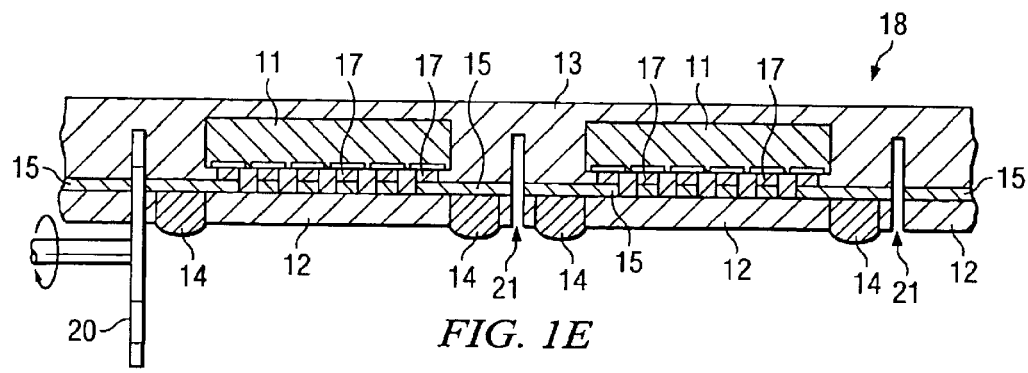
Figure 1F:
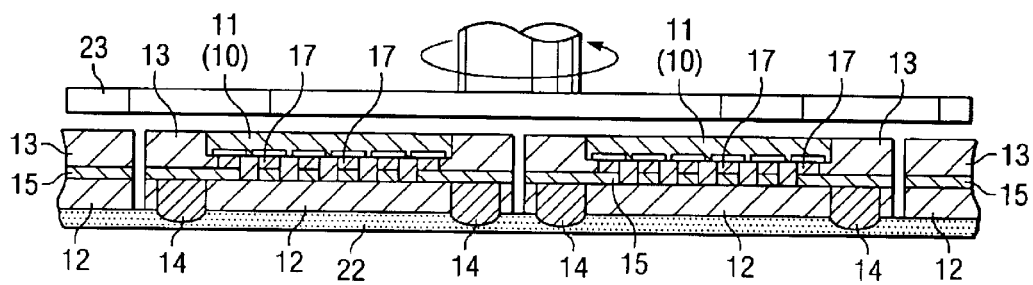
Figure 2A:
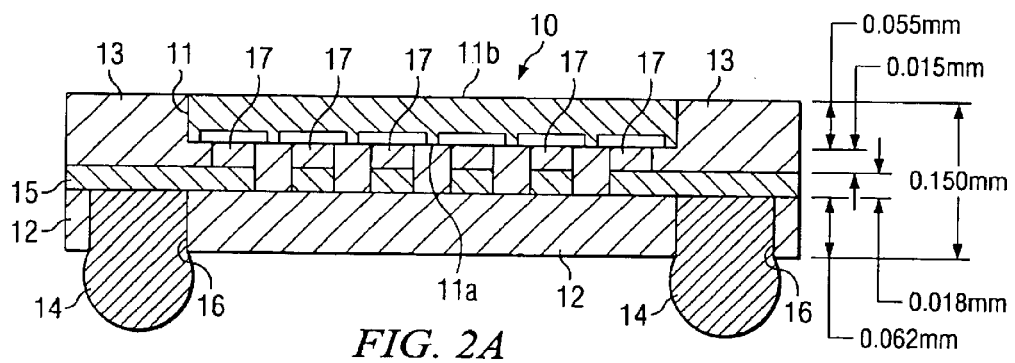
FIG. 2 represents cross sections of the semiconductor device produced by the semiconductor device manufacturing method pertaining to the first embodiment of the present invention.
Figure 2B:
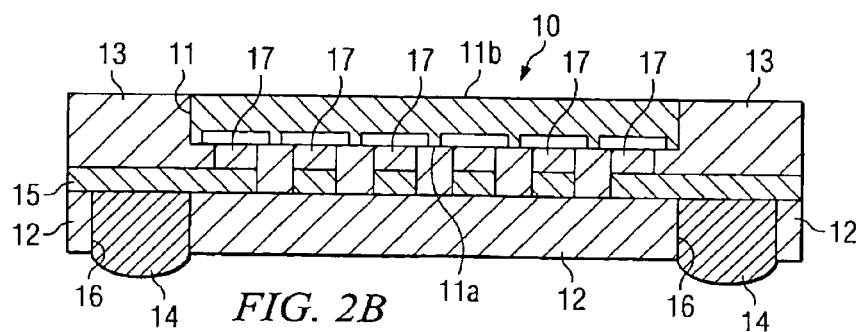

FIG. 1 is a set of diagrams showing the semiconductor device production steps pertaining to the first embodiment of the present invention. FIG. 2 represents cross sections of the semiconductor device produced by the semiconductor device production steps pertaining to the first embodiment of the present invention. As shown in these diagrams, semiconductor device 10 is configured with semiconductor chip 11, substrate 12 on which said semiconductor chip 11 is mounted, molding resin 13 for sealing semiconductor chip 11 mounted on said substrate 12, and bump electrodes 14 for external substrate mounting formed on the bottom of aforementioned substrate 12. Each production step of semiconductor devices 10 will be explained below.

The step for producing substrate 12 is carried out prior to the production steps illustrated. Substrate 12 is made of a polyimide resin film with a thickness of approximately 62 $\mu$m, and multiple chip mounting areas are formed adjoined to each other at a prescribed distance on its top plane. Circuit pattern 15 having a thickness of approximately 18 $\mu$m is formed in each chip mounting area by means of a copper foil etching. Furthermore, multiple via holes 16 are formed on substrate 12, and circuit pattern 15 and external substrate mounting bump electrodes 14 are connected by said via holes 16.

In the first step (A) pertaining to the first embodiment, multiple semiconductor chips 11 having bump electrodes 17 formed on their functional planes 11a are prepared. Semiconductor chips 11 are obtained by forming many semiconductor element patterns on one side of a silicon wafer and dicing it into pieces. Bump electrodes 17 are formed on the semiconductor patterns by means of a plating or a bonder, and metal stud bumps, solder stud bumps, metal plated bumps, or solder plated bumps, for example, are formed. The thickness of semiconductor chip 11 prepared in step (A) is for example 625 $\mu$m. In the case of a semiconductor chip 11 having this much thickness, cracks due to its handling are unlikely to occur during the substrate mounting step and the steps previous to it, so that the yield never drops.

In the next step (B) pertaining to the first embodiment, multiple semiconductor chips 11 prepared in step (A) are mounted onto the respective chip mounting areas of substrate 12 with their faces facing downward using the flip-chip method. That is, functional planes 11a of semiconductor chips 11 are placed to face against the respective chip mounting areas of substrate 12, bump electrodes 17 are aligned with circuit patterns 15 on substrate 12, and bump electrodes 17 are then melted by means of reflow in order to establish an electrical connection between semiconductor chips 11 and substrate 12. When said step (B) is completed, a gap of approximately 15 $\mu$m is formed between semiconductor chips 11 and substrate 12, and an underfilling material (not illustrated) is injected into said gap, as it is needed.

In the next step (C) pertaining to the first embodiment, molding resin 13 (molding compound) is injected onto the top plane of substrate 12 in order to form resin sealed block 18 in which multiple semiconductor chips 11 are sealed. That is, semiconductor chips 11 on substrate 12 are set into the cavities of a mold (not illustrated), and a molding compound is injected into said cavities. At this time, a prescribed gas is present between non-functional planes 11b of semiconductor chips 11 and the cavities, and the fluidity of the molding compound in the cavities is assured by said gap. Accordingly, the molding compound is injected into the cavities quickly, so that highly accurate molding is efficiently carried out.

In the next step (D) pertaining to the first embodiment, external substrate mounting bump electrodes 14 are formed on the bottom of substrate 12. External substrate mounting bump electrodes 14 have the BGA (Ball Grid Array) structure shown in FIG. 2(A) or the LGA (Land Grid Array) structure shown in FIG. 2(B), and they are formed by either mounting solder balls or by applying printing processing using a solder paste onto the external substrate mounting plane of substrate 12 and then applying reflow processing.

In the next step (E) pertaining to the first embodiment, aforementioned resin sealed block 18 is cut halfway to a prescribed depth from the bottom side of substrate 12 along long lines separating semiconductor devices 10. After the surface of molding resin 13 of resin sealed block 18 is fixed directly by suction using a vacuum chuck (not illustrated), dicer 20 is used to cut substrate 12 halfway from the bottom side. In the present embodiment, 500 μm deep cut recesses 21 are formed with respect to 650 μm thick molding resin 13, and the connection between the respective semiconductor device parts of resin sealed block 18 is maintained by the remaining 100 μm thick portion. That is, although the depth of cut recesses 21 formed on molding resin 13 can be set arbitrarily as long as the connecting condition of the respective semiconductor device parts is maintained, it is preferable that it is no greater than 30% of the thickness of molding resin 13. In such case, the minimum connecting strength is attained, and prevents the problem of resin sealed block 18 breaking during handling after it is cut halfway.

Figure 3A:
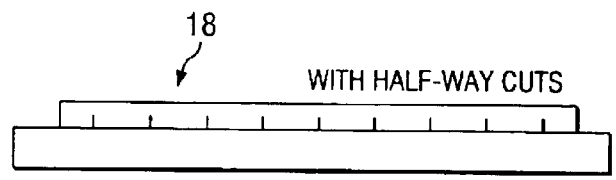
FIG. 3 represents diagrams for illustrating the function pertaining to the first embodiment of the present invention.
Figure 3B:
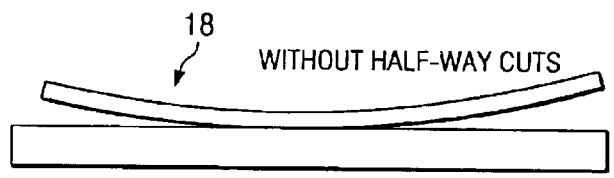

In the next step (F) pertaining to the first embodiment, aforementioned resin sealed block 18 is ground from the top side of molding resin 13 at least until aforementioned cut recesses 21 are reached in order to separate semiconductor devices 10 from one another. That is, in said step (F), after the retaining tape is put on the bottom of substrate 12, the bottom of substrate 12 is fixed by suction via said retaining tape using the vacuum chuck (not illustrated), and the top side of molding resin 13 is then ground using grinder 23. At this time, resin sealed block 18 suctioned by the vacuum chuck has increased flexibility due to cut recesses 21 formed in the previous step (E). Thus, as shown in FIG. 3, it is suctioned firmly by vacuum chuck 19 even when a warpage is present. Accordingly, resin sealed block 18 remains flat, and it is ground evenly by grinder 23. Furthermore, aforementioned retaining tape 22 is formed by applying an adhesive layer of an acrylic adhesive onto a base material. When it is put on the bottom of substrate 12, it adheres tightly to the entire bottom plane of substrate 12 as the adhesive layer adheres to bump electrodes 14 formed on the bottom of substrate 12.

In the present embodiment, grinder 23 keeps grinding molding resin 13 containing semiconductor chips 11 until semiconductor chips 11 attain a prescribed thickness, for example, 55 μm, even after it has reached cut recesses 21. As a result, semiconductor devices 10 separated into individual pieces are low-profiled to 150 μm (excluding the height of external substrate mounting bump electrode 14). Although the amount semiconductor chips 11 are ground can be set arbitrarily as long as they do not loose their functionality, it is preferable that the thickness of semiconductor chips 11 after the grinding is 60% or less of that before the grinding. In such case, semiconductor devices 10 can be drastically low-profiled while preventing semiconductor chips 11 from being cracked prior to their mounting onto the substrate.

Figure 4:
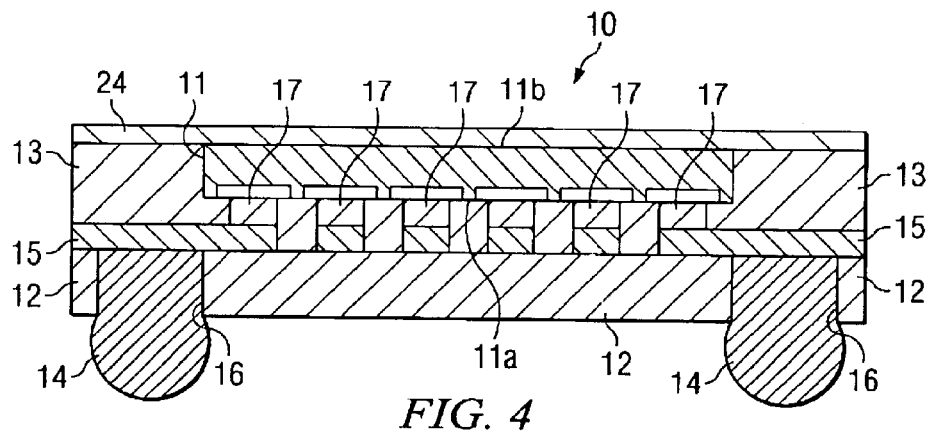
FIG. 4 is a cross section of the semiconductor device produced by the semiconductor manufacturing method pertaining to the second embodiment of the present invention.
Figure 5:
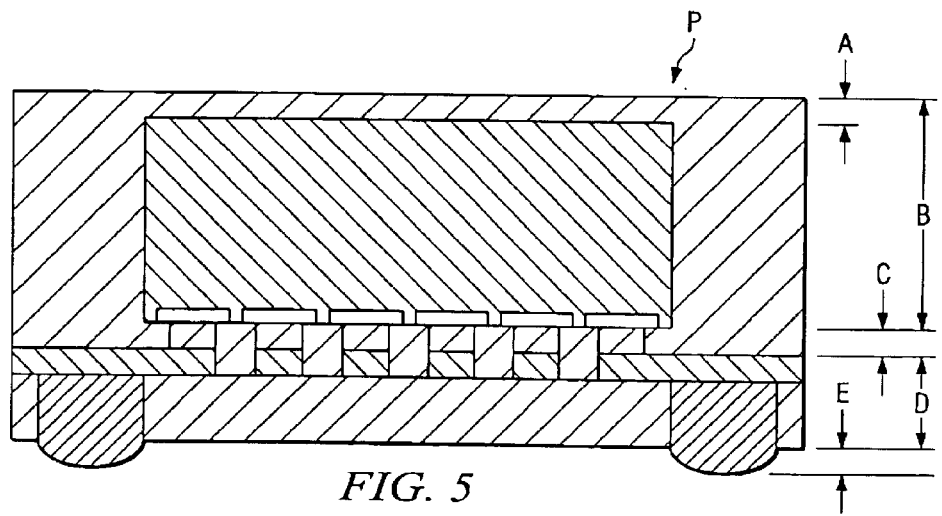
FIG. 5 is a cross section showing the conventional semiconductor device.

Next, a second embodiment of the present invention will be explained using the corresponding figures. FIG. 4 is a cross section of the semiconductor device produced by the semiconductor device production steps pertaining to the second embodiment of the present invention. As shown in said figure, in the second embodiment, a step in which heat sink 24 is joined onto the ground plane of semiconductor device 10 obtained through production steps (A) through (F) in the first embodiment is further provided. Said heat sink 24 not only improves the heat dissipation of semiconductor chip 11, but it also protects semiconductor chip 11.

As described above, in the embodiment of the present invention, the following steps are provided: step (B) in which multiple semiconductor chips 11 are mounted onto substrate 12 having multiple adjoining chip mounting areas while placing their functional planes 11a facing the top plane of said substrate 12, step (C) in which molding resin 13 is injected onto the top plane of aforementioned substrate 12 in order to form resin sealed block 18 in which aforementioned multiple semiconductor chips 11 are sealed, step (E) in which aforementioned resin sealed block 18 is cut halfway to a prescribed depth from the bottom side of aforementioned substrate 12 along separating lines between semiconductor devices 10, and step (F) in which aforementioned resin sealed block 18 is ground from the top side of aforementioned molding resin 13 at least until cut recesses 21 formed by being cut halfway is reached in order to separate it into individual semiconductor devices 10. In other words, not only semiconductor devices 10 be low-profiled by grinding resin sealed block 18, warpage of resin sealed block 18 can also be eliminated to achieve even grinding. Moreover, the production process can be simplified, and the amount of the tape used can be reduced by reducing the tape application step.

In addition, the external substrate mounting bump electrodes can be formed in the stage before semiconductor device block 18 is cut halfway because step (D) in which bump electrodes 14 for mounting aforementioned semiconductor devices 10 onto an external substrate are formed on the bottom of aforementioned substrate 12 is provided before step (E) in which aforementioned resin sealed block 18 is cut halfway. As a result, the handling of resin sealed block 18 during the formation of the bump electrodes can be made easy.

In addition, in step (E) in which aforementioned resin sealed block 18 is cut halfway, a minimum connecting strength can be attained in order to prevent sealed block 18 from breaking because the depth of aforementioned cut recesses 21 formed on aforementioned molding resin 13 is 30% or less of the thickness of said molding resin.

In addition, the application of retaining tape 22 needs to be carried out only once because the surface of aforementioned molding resin 13 is directly fixed by suction directly using the vacuum chuck prior to the aforementioned half cut in step (E) in which aforementioned resin sealed block 18 is cut halfway, and retaining tape 22 is put on the bottom of aforementioned substrate 12, and the bottom of aforementioned substrate 12 is fixed by suction via aforementioned retaining tape 22 by the vacuum chuck prior to the grinding in step (F) in which aforementioned resin sealed block 18 is ground in order to separate it into individual semiconductor devices 10. As a result, not only can the production process be simplified, but the amount of retaining tape 22 used can be reduced.

In addition, in step (F) in which aforementioned resin sealed block 18 is ground in order to separate it into individual semiconductor devices 10, semiconductor chips 11 can be made thinner while being sealed in molding resin 13 without low-profiling them prior to their substrate mounting because aforementioned molding resin 13 is ground together with said semiconductor chips 11 from its top side until said semiconductor chips 11 attains the prescribed thickness. As a result, the problem of semiconductor chips 11 breaking during the handling prior to the substrate mounting can be prevented, so that the productivity and the yield can be improved.

In addition, in step (F) in which aforementioned resin sealed block 18 is ground in order to separate it into individual semiconductor devices 10, semiconductor devices 10 can be low-profiled drastically while preventing the breakage of semiconductor chips 11 prior to the substrate mounting because the thickness of aforementioned semiconductor chips 11 after said step (F) becomes 60% or less of the thickness before said step (F).

In addition, in the second embodiment, because heat sink 24 is joined onto the ground planes of said semiconductor devices 10 after step (F) in which aforementioned resin sealed block 18 is ground in order to separate it into individual semiconductor devices 10, not only can the heat dissipation trait of semiconductor chips 11 be improved, but semiconductor chips 11 can also be protected by heat sink 24.

Embodiments of the present invention have been described above using figures. However, the present invention is not limited to the items shown in aforementioned embodiments, and the range in which those in the field can make changes and/or modifications based on the descriptions in the scope of the claims and the detailed explanation of the invention and other known technologies is also included therein. For example, although steps for producing semiconductor device 10 involving one semiconductor chip 11 were demonstrated in the aforementioned embodiments, the production method of the present invention can be also applied easily to the production of a multi-module mounted with two or more semiconductor chips 11.

As described, with the present invention, not only can the semiconductor devices be low-profiled by grinding the resin sealed block, but level grinding can also be realized by eliminating warpage of the resin sealed block. Moreover, the production process can be simplified, and the amount of tape used can be reduced by reducing the tape application step.

What is claimed is:

1. A semiconductor device manufacturing method comprising the steps of:
    providing a substrate having adjoining multiple chip mounting areas on a mounting surface;
    mounting multiple semiconductor chips having functional and non-functional surfaces on said mounting areas on said substrate such that the functional surfaces of said chips face said mounting surface of said substrate;
    sealing said multiple chips to said mounting surface of said substrate with molding resin;
    cutting through said substrate from a surface of said substrate opposite said mounting surface into said molding resin to a depth of 30% or less of the depth of said molding resin to form recesses between said chip mounting areas on said substrate;
    removing portions of said molding resin and said multiple chips from said mounting surface of said substrate to reach said recesses, thereby separating said multiple chip mounting areas of said substrate to form individual semiconductor devices, each of which contains one or more of said multiple semiconductor chips.

2. The semiconductor device manufacturing method of claim 1 further comprising the step of forming external connection terminals on the surface of said substrate opposite said mounting surface prior to said step of cutting through said substrate.

3. The semiconductor device manufacturing method of claim 1 further comprising the step of holding said substrate during said cutting step with a suction device.

4. The semiconductor device manufacturing method of claim 1 wherein said step of removing portions of said molding resin and said multiple chips comprises removing portions of said chips such that the thickness of said chips after said removal step is 60% or less of the thickness before said removal step.

5. The semiconductor device manufacturing method of claim 1 further comprising the step of forming a heat sink on said multiple chips after said step of removing portions of said molding resin and said multiple chips.

6. The semiconductor device manufacturing method of claim 1 further comprising the step of applying retaining tape on said substrate prior to said step of removing portions of said molding resin and said multiple chips.

7. The semiconductor device manufacturing method of claim 6 further comprising the step of holding said substrate by applying suction to said retaining tape.

8. A semiconductor device manufacturing method comprising the steps of:
    providing a substrate having adjoining multiple chip mounting areas on a mounting surface;
    mounting multiple semiconductor chips having functional and non-functional surfaces on said mounting areas on said substrate such that the functional surfaces of said chips face said mounting surface of said substrate;
    sealing said multiple chips to said mounting surface of said substrate with molding resin;
    cutting through said substrate from a surface of said substrate opposite said mounting surface into said molding resin to a prescribed depth to form recesses between said chip mounting areas on said substrate;
    removing portions of said molding resin and said multiple chips from said mounting surface of said substrate to reach said recesses and such that the thickness of said chips after said removal step is 60% or less of the thickness before said removal step, thereby separating said multiple chip mounting areas of said substrate to form individual semiconductor devices, each of which contains one or more of said multiple semiconductor chips.

9. The semiconductor device manufacturing method of claim 8 further comprising the step of forming external connection terminals on the surface of said substrate opposite said mounting surface prior to said step of cutting through said substrate.

10. The semiconductor device manufacturing method of claim 8, wherein in said step of cutting said prescribed depth is 30% or less of the thickness of said molding resin.

11. The semiconductor device manufacturing method of claim 8 further comprising the step of holding said substrate during said cutting step with a suction device.

12. The semiconductor device manufacturing method of claim 8 further comprising the step of forming a heat sink on said multiple chips after said step of removing portions of said molding resin and said multiple chips.

13. The semiconductor device manufacturing method of claim 8 further comprising the step of applying retaining tape on said substrate prior to said step of removing portions of said molding resin and said multiple chips.

14. The semiconductor device manufacturing method of claim 13 further comprising the step of holding said substrate by applying suction to said retaining tape.

* * * * *